(12) United States Patent
Miyamae

(10) Patent No.: US 7,065,275 B2
(45) Date of Patent: Jun. 20, 2006

(54) OPTIC COMMUNICATIONS MODULE, METHOD FOR MANUFACTURING THE SAME, OPTIC COMMUNICATIONS DEVICE, AND ELECTRONIC EQUIPMENT

(75) Inventor: Akira Miyamae, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 243 days.

(21) Appl. No.: 10/849,785

(22) Filed: May 21, 2004

(65) Prior Publication Data
US 2005/0008302 A1    Jan. 13, 2005

(30) Foreign Application Priority Data
Jun. 18, 2003    (JP)    ............... 2003-174056

(51) Int. Cl.
G02B 6/30  (2006.01)
G02B 6/36  (2006.01)
G02B 6/12  (2006.01)
G02B 6/38  (2006.01)

(52) U.S. Cl. .................... 385/49; 385/88; 385/14; 385/70; 385/90; 385/92

(58) Field of Classification Search .......... 385/14, 385/49, 70, 88, 90, 92
See application file for complete search history.

(56) References Cited

U.S. PATENT DOCUMENTS

| | | | |
|---|---|---|---|
| 5,249,245 A | 9/1993 | Lebby et al. | |
| 6,707,161 B1* | 3/2004 | Moon et al. | 257/778 |
| 6,931,177 B1* | 8/2005 | Suzuki et al. | 385/33 |
| 6,932,519 B1* | 8/2005 | Steinberg et al. | 385/92 |
| 2001/0024551 A1* | 9/2001 | Yonemura et al. | 385/88 |
| 2003/0026303 A1* | 2/2003 | Ouchi | 372/36 |

FOREIGN PATENT DOCUMENTS

| | | |
|---|---|---|
| JP | A 55-138283 | 10/1980 |
| JP | A 4-241477 | 8/1992 |
| JP | U 6-47910 | 6/1994 |
| JP | U 6-64215 | 9/1994 |
| JP | A 6-310759 | 11/1994 |
| JP | A 9-307208 | 11/1997 |
| JP | A 2000-512029 | 9/2000 |
| JP | A 2000-349307 | 12/2000 |
| JP | A 2001-201670 | 7/2001 |
| JP | A 2002-164602 | 6/2002 |
| WO | WO 97/46901 | 12/1997 |

OTHER PUBLICATIONS

U.S. Appl. No. 10/730,105, filed Dec. 9, 2003, Miyamae et al.
U.S. Appl. No. 10/792,894, filed Mar. 5, 2004, Miyamae et al.

* cited by examiner

Primary Examiner—Brian Healy
Assistant Examiner—Charlie Peng
(74) Attorney, Agent, or Firm—Oliff & Berridge, PLC

(57) ABSTRACT

The present invention provides a compact optic communications module. An optic communications module according to the invention can include a base including a portion defining a through-hole through a first plane to a second plane into which an optical fiber is inserted, a fiber optic piece located on the first plane side in the through-hole and whose axis length is shorter than the distance between the first plane and the second plane, a transparent resin film provided on the first plane of the base so as to cover the through-hole, a wiring film provided on at least one surface of the transparent resin film, and an optical element aligned on the optical axis of the fiber optic piece with the transparent resin film therebetween and coupled to the wiring film.

12 Claims, 9 Drawing Sheets

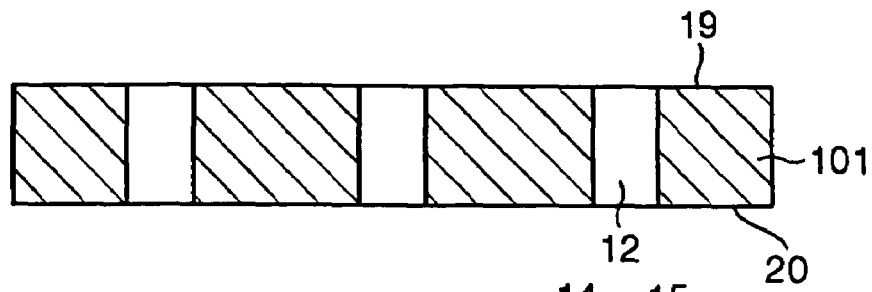
Fig. 2a
Fig. 2b
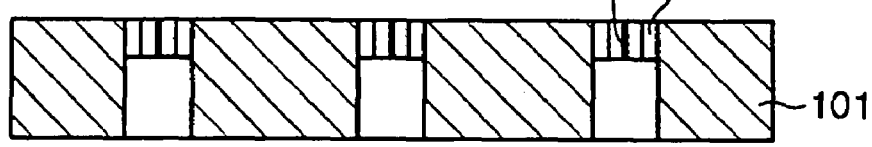
Fig. 2c
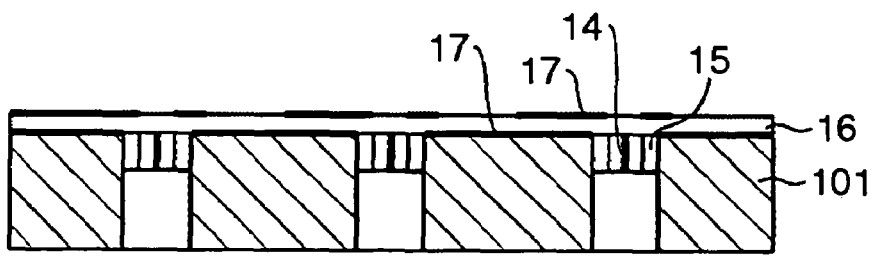
Fig. 2d
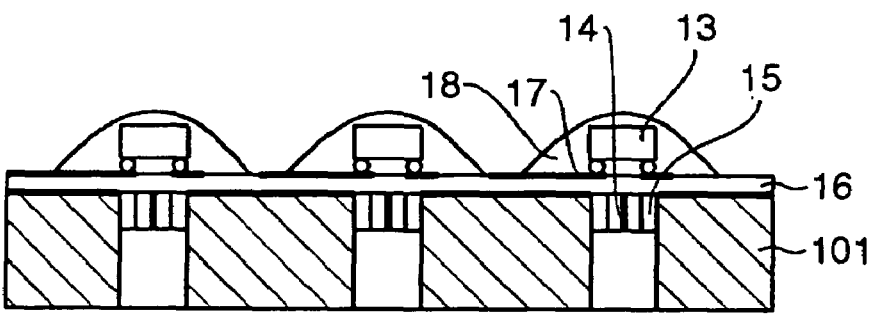
Fig. 2e
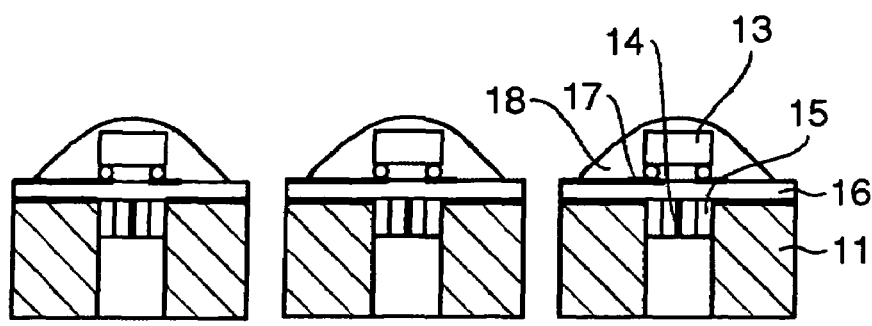

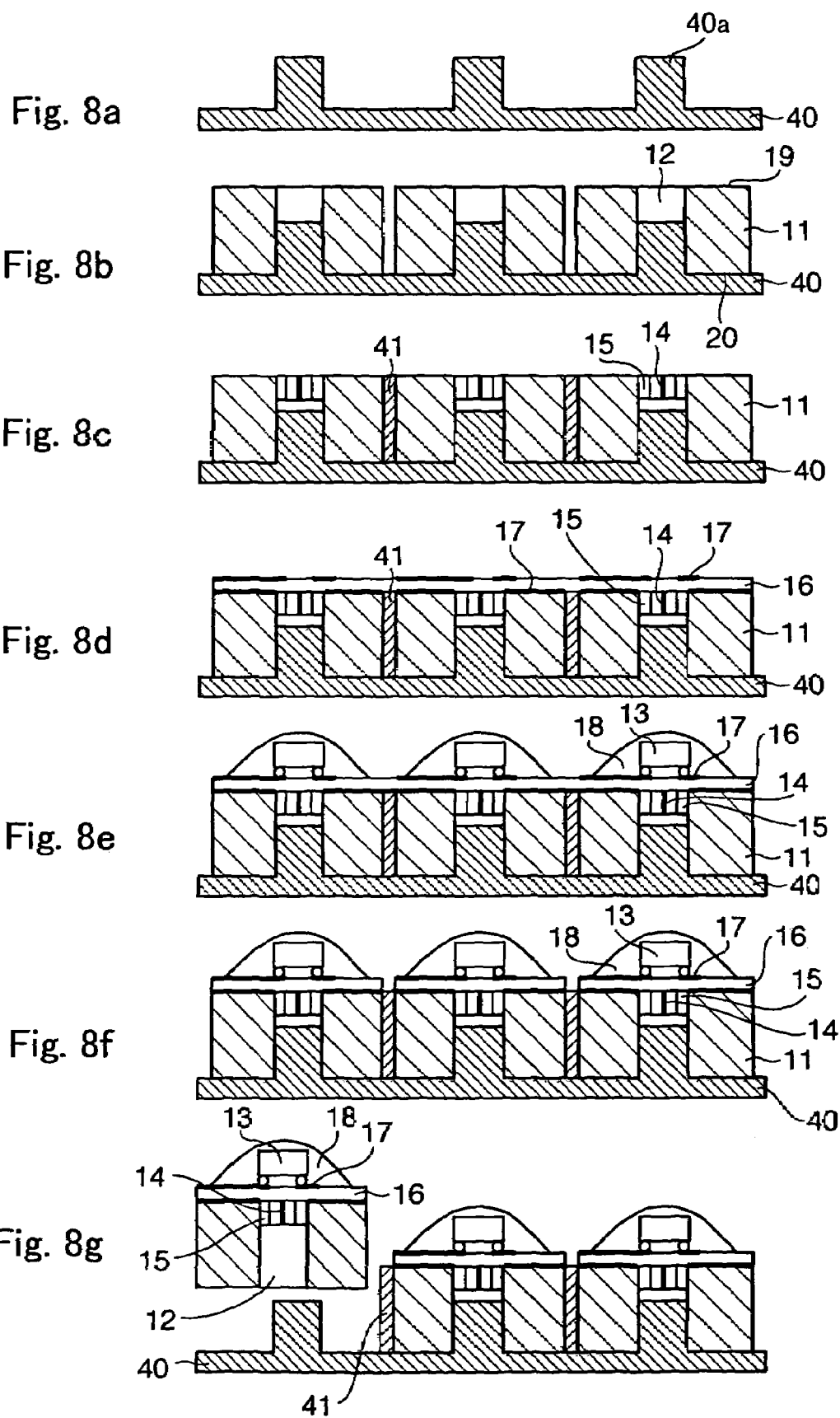

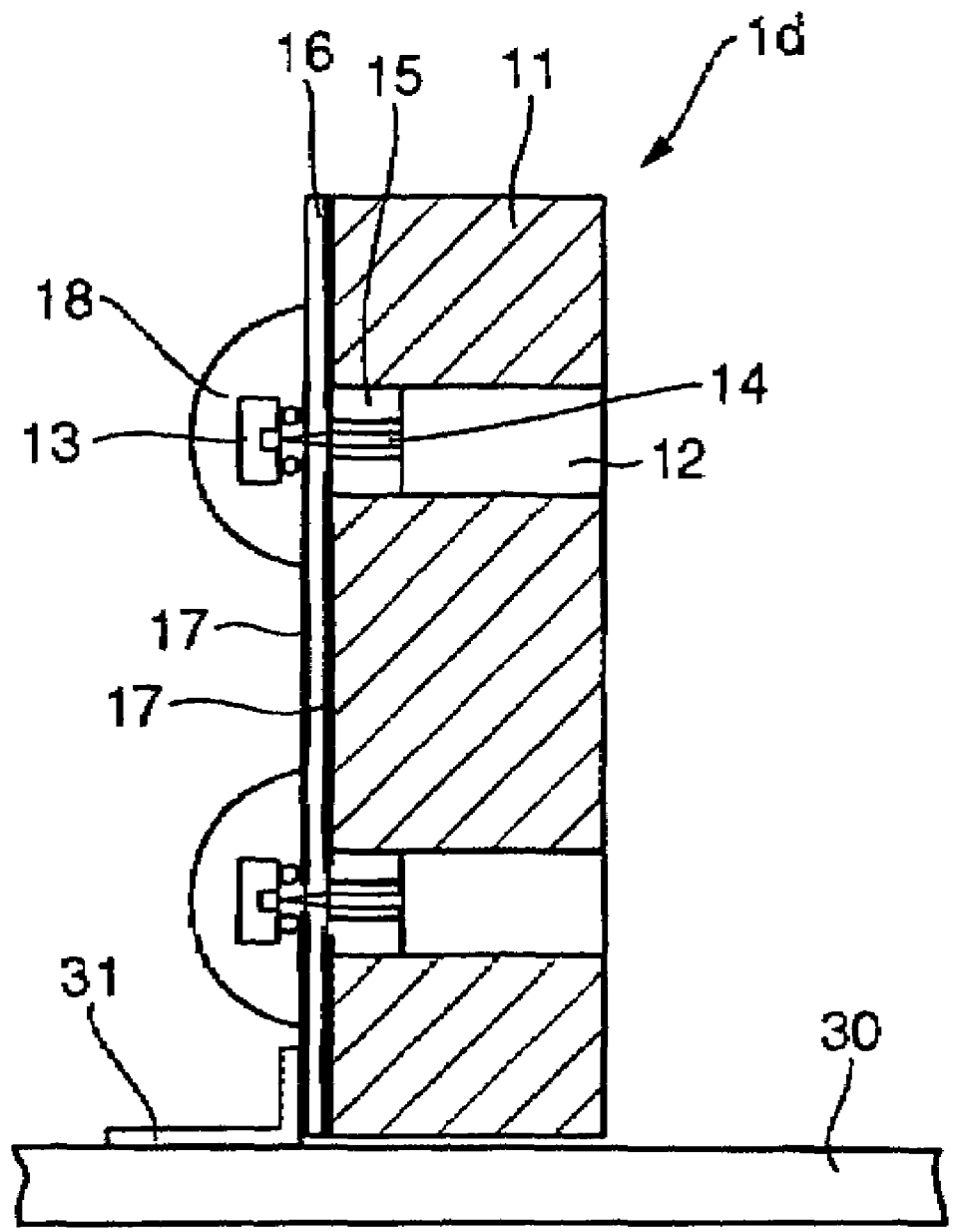

OPTIC COMMUNICATIONS MODULE, METHOD FOR MANUFACTURING THE SAME, OPTIC COMMUNICATIONS DEVICE, AND ELECTRONIC EQUIPMENT

CROSS-REFERENCE TO RELATED APPLICATION

The present application claims priority to Japanese Patent Application No. 2003-174056 filed Jun. 18, 2003 which is hereby expressly incorporated by reference herein in its entirety.

BACKGROUND OF THE INVENTION

1. Field of Invention

The invention relates to an optic communications module that is suitable for use in an optic communications system, and a method for manufacturing the same.

2. Description of Related Art

A light emitting element that converts an electronic signal into an optical signal, a light receiving element that converts an optical signal into an electronic signal, and an optical fiber that couples the light emitting element and the light receiving element constitute the basic structure of an optic communications system. In order to connect and disconnect an optical element (a light emitting/receiving element) and an optical fiber, optic communications modules such as a connector for optically coupling the optical element and the optical fiber have been used. An example of such optic communications modules is disclosed in Japanese laid-open patent application No. 2000-349307.

The optic communications module described above, however, needs to include a bump around a through-hole for coupling and holding an optical element so that the element can be mounted on the through-hole into which an optical fiber is inserted. The diameter of this through-hole is determined by the diameter of the optical fiber or of a ferrule that retains the optical fiber. This means that the optical element needs to be larger than the diameter of the fiber or the ferrule, and the element tends to become large as a result. This eventually increases cost and makes it difficult to further reduce the size of such an optic communications module.

In addition, it is difficult to assemble a typical optic communications module into which an optical fiber is inserted merely with mechanical alignment without optical adjustment, that is, alignment based on optical signals. This makes a manufacturing process complicated and further increases cost.

SUMMARY OF THE INVENTION

In consideration of the above-mentioned problems, the invention aims to economically provide a compact optic communications module into which an optical fiber is inserted.

In order to achieve the above-mentioned aim, an optic communications module of the invention can include a base, a fiber optic piece, a transparent resin film, a wiring film, and an optical element. The base has a through-hole through a first plane to a second plane of the base into which an optical fiber is inserted. The fiber optic piece is located in the through-hole on the first plane side of the base, and its axis length is shorter than the distance between the first plane of the base and the second plane of the base. The transparent resin film is provided on the first plane of the base so as to cover the through-hole. The wiring film is provided on at least one surface of the transparent resin film. The optical element is aligned on the optical axis of the fiber optic piece with the transparent resin film therebetween, and coupled to the wiring film.

With this configuration, the alignment of the fiber optic piece and the inserted optical fiber is made using the single through-hole. Thus, the optic communications module with a simple structure and high alignment accuracy can be provided. Moreover, the simple structure makes the assembly easy and the manufacturing process simple. Also, since the transparent resin film is provided above the through-hole, it is possible to mount the optical element smaller than the diameter of the through-hole into which the optical fiber is inserted. Therefore, the size of an applicable optical element can be determined irrespective of the diameter of the inserted optical fiber, which further reduces the size of the optic communications module.

In addition, since the transparent resin film separates the optical element and the optical fiber inserted into the through-hole, the ambient air and moisture from the insertion side of the optical fiber have no adverse effect, which further increases the sealing effect of the optical element.

The fiber optic piece is preferably surrounded and covered by a ferrule. When the fiber optic piece is provided with the ferrule, its surrounding surface is protected by the ferrule. This makes it easy to handle the fiber optic piece and increases manufacturing efficiency.

It is preferable that the diameter of the through-hole is substantially even through the first plane to the second plane of the base. This makes it easy to provide the through-hole in the base, which enhances manufacturing efficiency. It becomes also possible to use a segmented optical fiber that is inserted as the fiber optic piece, which further increases manufacturing efficiency. The inserted optical fiber may be built in a ferrule. In this case, the fiber optic piece surrounded and covered by the ferrule is used.

It is also preferable that the diameter of the through-hole on the first plane side of the base is substantially the same as the diameter of the fiber optic piece, and the diameter of the through-hole on the second plane side of the base is substantially the same as the diameter of a ferrule covering the optical fiber inserted into the through-hole. With this structure, fixing the fiber optic piece in a small-diameter part, whose diameter is substantially the same as that of the fiber optic piece, of the through-hole can make the manufacturing process easier. The through-hole also has a large-diameter part into which an optical fiber provided with a ferrule is inserted and whose diameter is substantially the same as that of the ferrule. Since the end of the ferrule faces a step between the small-diameter part and the large-diameter part, a shock caused by inserting and removing the optical fiber does not have much effect on the fiber optic piece. Consequently, it is possible to provide an optic communications module that is hard to be damaged even if the ferrule is inserted and removed frequently.

The fiber optic piece is preferably located so as to have one end reaching the first plane of the base, or projecting outward of the base from the first plane. With the fiber optic piece on the same plane as one surface of the base, it is possible to polish the fiber optic piece and the base all at once. This can enhance efficiency and provide an optic communications module with little optical loss due to the scattering of light. Furthermore, with the fiber optic piece projecting from one surface of the base, it is possible to shorten the optical coupling distance between the fiber optic piece and the optical element, which further reduces optical loss.

It is also preferable that an inner layer including the wiring film is further provided between the transparent resin film and the base, and the fiber optic piece is located so as to project outward of the base from the first plane of the base, and the projecting part of the fiber optic piece can be inserted into a hole provided in the inner layer. With this structure in which the projecting part of the fiber optic piece can be inserted into the hole provided in the inner layer including the wiring layer, it is possible to shorten the optical coupling distance between the fiber optic piece and the optical fiber. Thus, an optic communications module with little optical loss can be provided. Furthermore, since this requires no modifying or processing of the transparent resin film, the optic communications module can be provided with a simple manufacturing process.

Here, the inner layer can be provided between the transparent resin film and the base, and may include a bonding layer (such as a bonding sheet) and a protective film (e.g. solder resist and coverlay film) besides the wiring film.

Here, it is preferable that the projecting part of the fiber optic piece is substantially as thick as the inner layer, i.e., the length of the hole. This allows the end of the projecting part of the fiber optic piece to face the transparent resin film, which further reduces optical coupling loss.

It is also preferable that the optical element is aligned using the fiber optic piece, the ferrule, or the through-hole as a reference. Thus, the alignment of the optical element is made merely with mechanical alignment, and thereby making it possible to provide an optic communications module with high accuracy in a simple manufacturing process.

The transparent resin film and the wiring film are preferably formed with a flexible printed circuit (FPC). This makes it easy to form a wiring circuit on the substrate, and with the result of this the manufacturing process becomes simpler.

It is also preferable that the wiring film is provided on each of both sides of the transparent resin film, and the transparent resin film and the wiring film on the both sides make up a microstrip line. This makes it possible to reduce transmission loss in a high-frequency range and provide an optic communications module that is suitable for high-speed operations of the optical element. The transparent resin film is preferably an electric insulator and a dielectric. As such a transparent resin film, a polyimide film is used, for example. In addition, the optical element is preferably a surface emitting laser. This makes it possible to further reduce the size of the optic communications module.

An optic communications device (optical transceiver) according to the invention can include the above-mentioned optic communications module. With this configuration including the optic communications module, it is possible to economically provide a high-performance optic communications device. This further reduces the size of such a device. Here, the optic communications device may not only include devices with both an element on the sending side of optical signals (a light emitting element etc.) and an element on the receiving side of optical signals (a light receiving element etc.), but also include devices having either of such an element on the sending side (an optical transmitting module etc.) or such an element on the receiving side (an optical receiving module etc.).

Electronic equipment according to the invention can include the above-mentioned optic communications module. With this configuration including the optic communications module, it is possible to economically provide high-performance electronic equipment. This further reduces the size of such electronic equipment. The electronic equipment according to the invention may include an optic communications device having the above-mentioned optic communications module. Here, the electronic equipment refer to equipment for performing specific functions using an electronic circuit etc. as a general term without limiting their configurations. Examples of these may include various equipment for information communications with an external device etc. via light as a transmission medium, e.g. personal computers, personal digital assistants (PDA), and electronic notebooks.

A method for manufacturing an optic communications module according to one aspect of the invention can include a first step for providing a base having at least one through-hole through a first plane to a second plane and locating at least one fiber optic piece whose axis length is shorter than the distance between the first plane of the base and the second plane of the base in each through-hole so as to have one end substantially reaching the first plane of the base or projecting outward of the base from the first plane of the base; a second step for providing a multilayer film including a transparent resin film and a wiring film on the first plane of the base so that at least the transparent resin film covers the at least one through-hole; and a third step for aligning at least one optical element on the optical axis of the at least one fiber optic piece with the transparent resin film therebetween and coupling each optical element to the wiring film.

Since the fiber optic piece is located in the through-hole with this configuration, the method can provide an optic communications module with high accuracy in simple steps without a complicated assembly process. Also by locating the fiber optic piece in the through-hole, while mounting the optical element, the transparent resin film on which the optical element is provided is supported at the back by the fiber optic piece. This prevents the transparent resin film from being damaged due to a pressure or shock caused by mounting the optical element, and thereby providing an optic communications module with high yields.

The base may be a unit base or a base plate including a plurality of base regions. This means that the above-mentioned manufacturing method can be applied not only to the manufacturing of a single optic communications module, but also to the manufacturing of a plurality of optic communications modules by separating the base into individual pieces that will be described later. The above-mentioned manufacturing method is also suitable for manufacturing an optic communications module for coping with multi-channel systems and an optic communications module providing an all-in-one solution for sending out and receiving information with a plurality of through-holes in each unit base.

The fiber optic piece is preferably surrounded and covered by a ferrule. When the fiber optic piece is provided with the ferrule, its surrounding surface is protected by the ferrule. This makes it easy to handle the fiber optic piece and increases manufacturing efficiency.

In the second step of the manufacturing method, the multilayer film is preferably formed by bonding an FPC. In particular, the FPC preferably makes up a microstrip line. This makes the manufacturing process simpler.

The second step also includes a step for forming the transparent resin film on the first surface side of the base so as to cover the through-hole, and a step for forming the wiring film on the transparent resin film.

It is also preferable that the diameter of the at least one through-hole is substantially even through the first plane to the second plane of the base. This makes it easy to provide the through-hole in the base, which increases manufacturing efficiency. It becomes also possible to use a segmented optical fiber that is inserted as the fiber optic piece, which further increases manufacturing efficiency. The inserted optical fiber may be built in a ferrule. In this case, the fiber optic piece surrounded and covered by the ferrule is used.

It is also preferable that the diameter of the at least one portion each defining the through-hole on the first plane side of the base is substantially the same as the diameter of the fiber optic piece or of a ferrule provided to the fiber optic piece, and the fiber optic piece is aligned and located using the through-hole on the first plane side of the base in the first step. In other words, the alignment of the fiber optic piece or the ferrule is made using the through-hole provided in the base, which is a simple process.

It is also preferable that, when the alignment of the fiber optic piece is made using the through-hole on the first surface side of the base in the first step, the through-hole is composed of at least two parts each having a different diameter. In this case, one diameter is substantially the same as the diameter of the fiber optic piece, and the other diameter is substantially the same as the diameter of the ferrule provided to the inserting optical fiber. With this structure, fixing the fiber optic piece in the small-diameter part, whose diameter is substantially the same as that of the fiber optic piece, of the through-hole can make the manufacturing process easier. The through-hole also has the large-diameter part into which a ferrule is inserted and whose diameter is substantially the same as that of the ferrule. Since the end of the ferrule faces a step between the small-diameter part and the large-diameter part, a shock caused by inserting and removing the ferrule does not have any effect on the fiber optic piece. Consequently, it is possible to provide an optic communications module that is hard to be damaged even if the ferrule is inserted and removed frequently.

It is also preferable that the fiber optic piece is located so as to substantially reach the first plane of the base in the first step, and also the first plane of the base and an end surface of the fiber optic piece or of the fiber optic piece provided with the ferrule are polished and planarized. This makes it possible to polish the first plane of the base and the end of the fiber optic piece or of the fiber optic piece provided with the ferrule all at once. This can enhance efficiency and provide an optic communications module with little optical loss caused by the scattering of light.

The manufacturing method may also include a fourth step for separating the base into individual pieces. By making such individual pieces after almost the whole assembly process of a plurality of optical communications modules is done by batch processing, it is possible to economically provide optical communications modules with high efficiency in manufacturing.

A method for manufacturing an optic communications module according to another aspect of the invention can include a first step for locating a plurality of unit bases each having at least one through-hole through a first plane to a second plane on a jig including on one side for holding the base more than one convex part whose axis length is shorter than the distance between the first plane and the second plane of the base by inserting the convex part into the through-hole; a second step for inserting a fiber optic piece whose axis length is shorter than the distance between the first plane and the second plane of the base from the first plane side of the base into the through-hole so as to substantially reach the first plane of the base or project from the first plane of the base; a third step for forming a multilayer film including a transparent resin film and a wiring film on the first plane of the base so that at least the transparent resin film covers the at least one through-hole; a fourth step for locating an optical element in a portion above the transparent resin film associated with the through-hole and coupling the optical element to the wiring film; and a fifth step for dividing the transparent resin film into individual regions corresponding to each of the unit bases.

By locating the fiber optic piece in the through-hole, while mounting the optical element, the transparent resin film on which the optical element is provided is supported at the back by the fiber optic piece. This can prevent the transparent resin film from being damaged due to a pressure or shock caused by mounting the optical element, and thereby providing an optic communications module with high yields. Moreover, since almost the whole assembly process of the optic communications module is done by batch processing like on a single base plate, it is possible to economically mass produce optic communications modules with high yields.

It is also preferable that the manufacturing method also includes a sixth step for filling a gap in between the unit bases with a fixing agent for fixing the unit bases after the first step. Since this enables batch processing like on a single base plate, it is possible to economically mass produce optic communications modules with high yields.

The fiber optic piece is preferably a fiber optic piece provided with a ferrule. When the fiber optic piece is provided with the ferrule, its surrounding surface is pro tected by the ferrule. This makes it easy to handle the fiber optic piece and increases manufacturing efficiency.

In the third step, the multilayer film is preferably an FPC. In particular, the FPC preferably makes up a microstrip line. This makes the manufacturing process simpler.

The third step may also include a step for forming the transparent resin film on the first surface side of the base so as to cover the through-hole, and a step for forming the wiring film on the transparent resin film.

It is preferable that the diameter of the at least one through-hole is substantially even through the first plane to the second plane of the base. This makes it easy to provide the through-hole in the base, which increases manufacturing efficiency. It becomes also possible to use a segmented optical fiber that is inserted as the fiber optic piece, which further increases manufacturing efficiency. The inserted optical fiber may be built in a ferrule. In this case, the fiber optic piece surrounded and covered by the ferrule is used.

It is also preferable that the diameter of the at least one through-hole on the first plane side of the base is substantially the same as the diameter of the fiber optic piece or of a ferrule provided to the fiber optic piece, and the fiber optic piece is aligned and located using the through-hole on the first plane side of the base in the second step. Therefore, the alignment of the fiber optic piece or the ferrule is made using the through-hole provided in the base, which is a simple process.

It is also preferable that, when the alignment of the fiber optic piece is made using the through-hole on the first surface side of the base in the second step, the through-hole is composed of at least two parts each having a different diameter. In this case, one diameter is substantially the same as the diameter of the fiber optic piece, and the other diameter is substantially the same as the diameter of the ferrule provided to the inserting optical fiber. With this structure, fixing the fiber optic piece in the small-diameter part, whose diameter is substantially the same as that of the fiber optic piece, of the through-hole can make the manufacturing process easier. The through-hole also has the large-diameter part into which a ferrule is inserted and whose diameter is substantially the same as that of the ferrule. Since the end of the ferrule faces a step between the small-diameter part and the large-diameter part, a shock caused by inserting and removing the ferrule does not have any effect on the fiber optic piece. Consequently, it is possible to provide an optic communications module that is hard to be damaged, even if the ferrule is inserted and removed frequently.

It is also preferable that the fiber optic piece is located so as to substantially reach the first plane of the base in the second step, and also the first plane and an end surface of the fiber optic piece or of the fiber optic piece provided with the ferrule are polished and planarized. This makes it possible to polish the first plane of the base and the end of the fiber optic piece or of the fiber optic piece provided with the ferrule all at once. This can enhance efficiency and provide an optic communications module with little optical loss caused by the scattering of light.

BRIEF DESCRIPTION OF THE DRAWINGS

This invention will be described with reference to the accompanying drawings, wherein like numerals reference like elements, and wherein:

FIG. 2 is a view illustrating a method for manufacturing the optic communications module according to the first embodiment;

FIG. 8 is a view illustrating a method for manufacturing the optic communications module according to a fifth embodiment; and FIG. 9 shows an example of an optic communications module including a plurality of through-holes.

DETAILED DESCRIPTION OF PREFERRED EMBODIMENTS

Embodiments of the invention will now be described with reference to the accompanying drawings.

Figure 1:
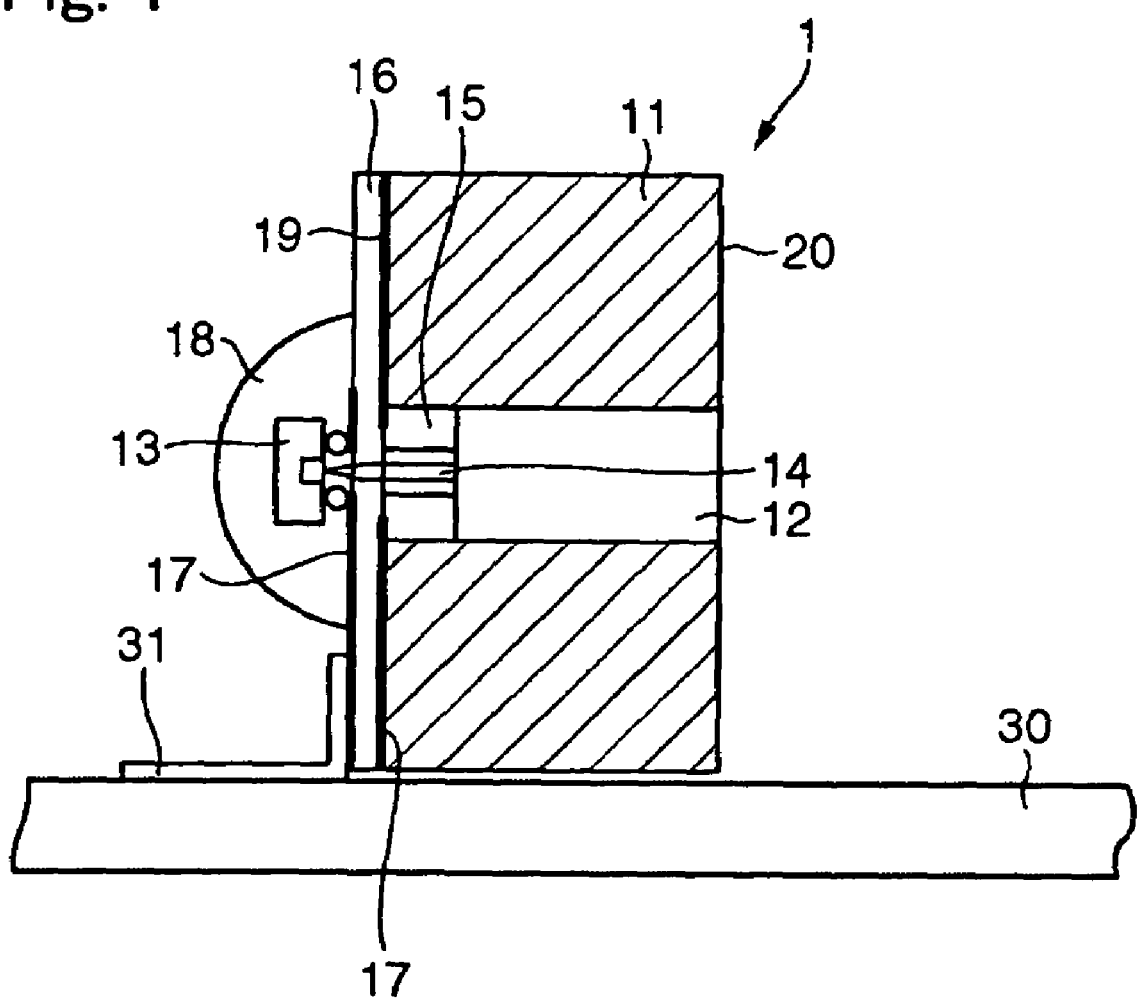
FIG. 1 is a sectional view of an optic communications device including an optic communications module according to a first embodiment of the invention.

FIG. 1 is a sectional view of an optic communications device including an optic communications module according to a first embodiment of the invention. An optic communications module 1 shown in FIG. 1 includes a base 11, an optical element 13, a fiber optic piece 14, a ferrule 15, a transparent resin film 16, a wiring film 17, and a sealing member 18. The optic communications module 1, an external substrate 30 on which an electronic circuit etc. is provided, and a connection terminal 31 make up an optic communications device.

The base 11 supports the elements of the optic communications module 1, and has a through-hole 12 into which an optical fiber not shown in the drawing is inserted. The base 11 can be made of various materials including conductive materials, such as stainless steel, aluminum, and copper, and nonconductive materials such as glass, resin, and ceramic. In this embodiment for example, the base 11 is made of ceramic.

The through-hole 12 is formed so as not to form any substantial clearance between the fiber optic piece, the optical fiber and the ferrule when the ferrule is provided around the fiber optic piece and the optical fiber. When no ferrule is provided to the fiber optic piece and the optical fiber, the through-hole 12 is formed so as to match the shape of the fiber optic piece and the optical fiber.

The optical element 13 is located above the through-hole 12 with the transparent resin film 16 and the wiring film 17 therebetween. The optical element 13 sends out signal light to the optical fiber inserted into the through-hole 12, or receives signal light emitted from the optical fiber. For example, if the optic communications module 1 is on the sending side, a light emitting element, such as a vertical cavity surface emitting laser (VCSEL), can be employed as the optical element 13. For another example, if the optic communications module 1 is on the receiving side, a light receiving element is used as the optical element 13. In this embodiment, the alignment of the optical element 13 is made using the through-hole 12, the fiber optic piece 14, or the ferrule 15 as a reference. Therefore, it is possible to provide an optic communications module with high alignment accuracy when inserting the optical fiber into the through-hole 12, compared to conventional modules using a can package.

The fiber optic piece 14 relays sending out and receiving of optical signals between the optical element 13 and the optical fiber. In other words, the fiber optic piece 14 leads light emitted from the optical element 13 to the optical fiber or light emitted from the optical fiber to the optical element 13 so as to optically couple the two. The fiber optic piece 14 is a piece whose axis length is shorter than the distance between one surface (first plane) 19 of the base 11 and the other surface (second plane), and is located on the one plane 19 side that is an upper surface of the base 11. In this embodiment, the diameter of the fiber optic piece 14 is substantially the same as the diameter of the inserted optical fiber. The fiber optic piece 14 is aligned with the through-hole, and fixed by being pressed into or bonded to the through-hole 12. The fiber optic piece 14 also prevents a shock caused by inserting and removing the optical fiber from directly affecting the optical element 13. This makes it possible to extend the life of the optic communications module.

The transparent resin film 16 is positioned so as to cover the whole surface of the through-hole 12 on one side of the base 11. The optical element 13 and the optical fiber are optically coupled with the transparent resin film 16 therebetween. The transparent resin film 16 may be formed by transparent resin materials such as polyimide and epoxy resin. Among others, a polyimide film is suitable in terms of good transmittance, flexibility, and usability. Here, a refractive index matching member (so-called matching oil) is applied to a joint surface between the transparent resin film 16 and the fiber optic piece 14, the ferrule 15 in order to fill the gap there, adjust refractive index differences between the fiber optic piece 14 and the transparent resin film 16, and avoid optical loss due to the scattering of optical signals.

This enhances efficiency in optical coupling. Examples of the refractive index matching member may include epoxy resin that has transmittance as high as that of an underfill that will be described later. When an FPC is used as the transparent resin film, a bonding sheet for joining the FPC and the base may be used as the refractive index matching member.

The wiring film 17 transmits signals between the optical element 13 and an external electronic circuit (external circuit) etc. not shown in the drawing but provided on the external substrate 30. The wiring film 17 is formed into a predetermined wiring pattern on the transparent resin film 16, using a conductive material, e.g., copper. In order to cope with high-speed operations of the optical element 13, a microstrip line suitable for transmitting high-frequency signals is preferably configured including the transparent resin film 16 and the wiring film 17. This configuration will be described in greater detail later. Here, the external circuit and the wiring film 17 may be coupled with a connection terminal, for example, a metal pin. Alternatively, by making one end of the transparent resin film 16 project outward from the base 11, the external circuit may be coupled to the wiring film 17 provided on the projecting end of the transparent resin film 16. The wiring film 17 may be provided on only one side of the transparent resin film 16.

The sealing member 18 is formed on the transparent resin film 16 so as to thoroughly cover the optical element 13 and protect the optical element 13. The sealing member 18 is made of epoxy resin, for example. It is also preferable as required that an underfill having a refractive index almost the same as that of the transparent resin film 16 is applied here in order to reduce optical loss between the optical element 13 and the transparent resin film 16. This prevents interface reflection and improves efficiency in optical coupling. As the underfill, for example, transparent epoxy resin is used.

A configuration of the microstrip line including the transparent resin film 16 and the wiring film 17 will now be described in detail. A conductive film has a concave matching a light emitting or receiving surface of the optical element 13. This aims to prevent the blocking of signal light or reduction in transmittance due to the conductive film. When using a transparent conductive film, such as an ITO film, it is unnecessary to have such a concave for transmitting signal light. Such a conductive film for coupling a ground potential is unnecessary if the base 11 is made of a conductive material such as stainless steel, since a ground potential can be directly coupled to the base 11, which makes the configuration and manufacturing process more simple.

When configuring such a microstrip line, its characteristic impedance is set at a desired value using the formula below. That is, with a characteristic impedance Z0 (Ω) of the microstrip line, a transmission line (the wiring film 17) width B, a line thickness C, a gap H between the transmission line and a ground (the conductive film 17 for a ground potential), and a specific inductive ∈r of a dielectric layer (the transparent resin film 16), the following equality is satisfied:

$$Z0 = (87/(\in r + 1.41)^{1/2}) * \ln(5.98 H/(0.8 B + C))$$

When the input/output impedance of the optical element 13 is 50 Ω, signal attenuation can be prevented by setting the characteristic impedance of the microstrip line at 50Ω and adjusting impedance differences. For example, the characteristic impedance Z0 of the microstrip line can be set around 50 Ω, when using a polyimide material whose specific inductive ∈r is 3.4 as the transparent resin film 16 with the following values: B=0.09 mm, H =0.05 mm, C=0.012 mm. If the thickness of the polyimide film gets smaller than this, the gap between conductive materials decreases and direct-current resistance tends to increase, and changes in impedances due to variance in line widths tend to increase. On the contrary, if the thickness of the polyimide film gets larger than this, efficiency in optical coupling between the optical fiber and the optical element tends to decrease.

Now, a method for manufacturing the optic communications module 1 of this embodiment having such a configuration will be described.

FIG. 2 is a view illustrating a method for manufacturing the optic communications module according to the first embodiment. First, a base plate 101 to be a base material of the base 11 included in each optic communications module 1 is provided as shown in FIG. 2(a). The base plate 101 has more than one through-hole 12. The diameter of the through-hole 12 is set substantially the same as that of the ferrule 15 (Φ 1.25 mm, for example), using an NC processing machine.

Next, the fiber optic piece 14 is pressed into and fixed in the through-hole 12 in a way that one end of the fiber optic piece 14 substantially reaches the first plane 19 side of the base plate 101 as shown in FIG. 2(b). The fiber optic piece 14 is built in the ferrule 15 in advance so as to be surrounded by the ferrule 15, and the length of the fiber optic piece 14 is shorter than the distance between the first plane and a second plane 20 of the base plate 101. On the side of the fiber optic piece 14 facing an optical fiber not shown in the drawing, the surface is preferably polished to a spherical surface or a plane by mechanical grounding, for example. This makes it possible to enhance efficiency in optical coupling between the optical fiber and the fiber optic piece 14. Also, the upper surface 19 of the base plate 101 and the end of the fiber optic piece 14 exposed on the upper surface 19 side are preferably polished and planarized all at once. Here, the fiber optic piece 14 built in the ferrule 15 may be inserted into the through-hole 12 and fixed with an adhesive, instead of being pressed and fixed.

Then, the transparent resin film 16 and the wiring film 17 are provided on the upper surface of the base plate 101 as shown in FIG. 2(c). This step is preferably performed by providing an FPC including one or more wiring patterns associated with one or more optic communications modules and bonding the FPC on the upper surface of the base plate 101. In this embodiment, an FPC including a microstrip line in which the conductive film 17 for grounding is provided on one side of the dielectric material and the conductive film 17 for signal transmission is provided on the other side is used. Bonding of the FPC and the base plate 101 is preferably done by thermocompression using a bonding sheet, with an adhesive, or the like. The transparent resin film 16 may be formed by applying a monomer or polymer precursor and hardening it with light or heat. More specifically, the transparent resin film 16 may be formed by applying polyamide acid as a polyimide precursor composed by condensing diamine and acid anhydride, heating and dehydrating the polyamide acid, for example. In this case, after the conductive film 17 for grounding is provided on the base 11 by spattering, beaten-copper bonding, or the like, the transparent resin film 16 is formed as mentioned above. Then a conductive film is provided again on the transparent resin film 16, and a transmission line (the wiring film 17) is formed by patterning.

Next, as FIG. 2(d) shows, the optical element 13 is mounted on the base plate 101 (on the transparent resin film 16) in a position associated with the through-hole 12, and then the sealing material 18 for protecting the optical element 13 is provided. In this step, the optical element 13 is coupled to the wiring film 17 by flip-chip bonding, for example. Since the transparent resin film 16 is supported by the fiber optic piece 14, it is possible to reliably mount the optical element 13 above the through-hole 12, while preventing the transparent resin film 16 from being deformed or damaged in mounting the optical element 13 in this step. Alignment for mounting the optical element 13 in this step is adjusted using the through-hole 12, the fiber optic piece 14, or the ferrule 15 provided on the base plate 101 as a reference. Since the alignment of the optical fiber is made when it is inserted into the through-hole 12, it is possible to easily adjust the optical axis of the optical fiber and of the optical element 13 by mounting the optical element 13 using the through-hole 12, the fiber optic piece 14, or the ferrule 15 as a reference. Also in this step, a driving circuit for driving the optical element 13 may be mounted as required. Examples of such a driving circuit may include a driver for a light emitting element and an amplifier for currents output from a light receiving element.

Next, the base plate 101 and the other elements are divided into individual pieces each making up the optic communications module 1 as shown in FIG. 2(e). The division is done by dicing, laser cutting, or the like. Through the above-mentioned steps, the optic communications module 1 according to this embodiment is completed.

Therefore, with the configuration of the optic communications module 1 according to this embodiment, the alignment of the fiber optic piece and the inserted optical fiber is made using the single through-hole. Thus, an optic communications module with a simple structure and high alignment accuracy can be economically provided. Moreover, the simple structure makes the assembly easy and the manufacturing process simple, which eventually enhances yields. Also, since the transparent resin film 16 is provided above the through-hole 12, it is possible to mount the optical element 13 that is compact irrespective of the diameter of the inserted optical fiber. As a result, a compact and economical optic communications module can be provided. In addition, since the transparent resin film 16 separates the optical element 13 and the optical fiber inserted into the through-hole 12, the ambient air and moisture from the insertion side of the optical fiber have no adverse effect, which increases the sealing effect of the optical element.

In the manufacturing method according to this embodiment, the through-hole 12 is covered by the transparent resin film 16, and the optical element 13 is mounted on the transparent resin film 16, with the other side of the transparent resin film 16 being supported by the fiber optic piece 14 and the ferrule 15 provided around it. This prevents the transparent resin film 16 from being damaged by a pressure and shock in mounting the optical element 13. Thus the optic communications module 1 with high yields can be provided. Moreover, since almost the whole assembly process of the optic communications module 1 is done by batch processing on a single base plate, it is possible to economically mass produce optic communications modules with high yields.

Figure 3:
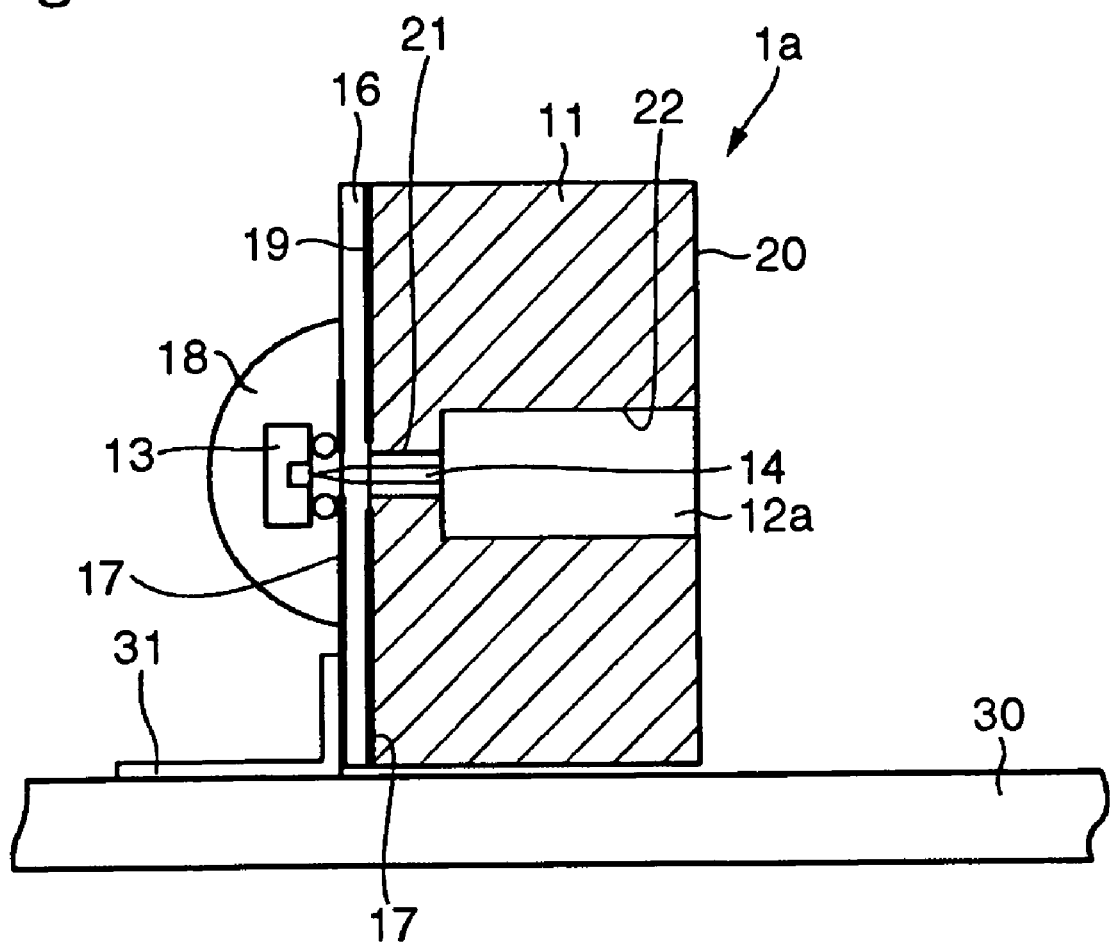
FIG. 3 is a sectional view of an optic communications device including an optic communications module according to a second embodiment of the invention.

FIG. 3 is a sectional view of an optic communications device including an optic communications module according to a second embodiment of the invention. An optic communications module 1a shown in FIG. 3 includes the base 11, the optical element 13, the fiber optic piece 14, the transparent resin film 16, the wiring film 17, and the sealing member 18. The optic communications module 1, the external substrate 30 on which an electronic circuit etc. is provided, and the connection terminal 31 make up an optic communications device. The optic communications module 1a of the present embodiment has a configuration almost the same as the optic communications module 1a of the first embodiment. The elements common to the two are indicated by the same numerals and further description of them is omitted here, while differences between the two will be described below.

According to this embodiment, a through-hole 12a includes a small-diameter part 21 on the first plane 19 side of the base 11 and a support part (large-diameter part) 22 on the second plane 20 side. The diameter of the small-diameter part 21 is substantially the same as that of the fiber optic piece 14. The support part 22 is capable of supporting an optical fiber (not shown in the drawing) to be inserted. The fiber optic piece 14 is pressed into and fixed in the small-diameter part 21. Here, the fiber optic piece 14 may be bonded with an adhesive after being pressed into the small-diameter part 21.

Now, a method for manufacturing the optic communications module 1a of this embodiment having such a configuration will be described.

FIG. 4 is a view illustrating a method for manufacturing the optic communications module according to the second embodiment.

Figure 4A:
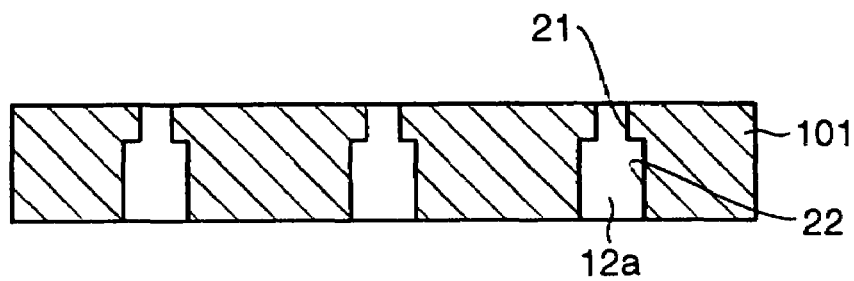
FIG. 4 is a view illustrating a method for manufacturing the optic communications module according to the second embodiment.

First, the base plate 101 to be a base material of the base 11 included in each optic communications module 1a is provided as shown in FIG. 4(a). In this embodiment, the through-hole 12a of the base plate 101 is composed of the small-diameter part 21 and the support part (large-diameter part) 22. More specifically, the diameter of the small-diameter part 21 is made substantially the same as that of the optical fiber piece, while the diameter of the support part 22 is made substantially the same as that of a ferrule surrounding the end of the optical fiber (not shown in the drawing), using an NC processing machine.

Figure 4B:
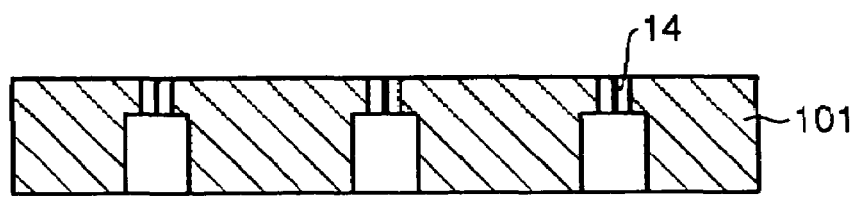

Next, the fiber optic piece 14 is pressed into and fixed in the through-hole 12 in a way that one end of the fiber optic piece 14 substantially reaches the first plane 19 side of the base plate 101 as shown in FIG. 4(b).

Figure 4C:
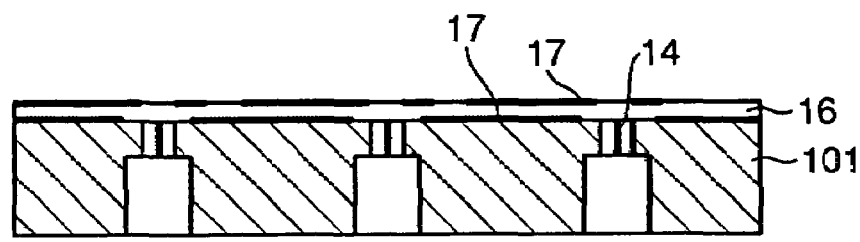
Figure 4D:
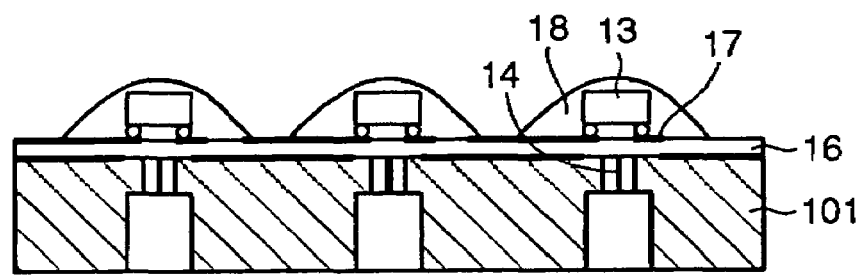
Figure 4E:
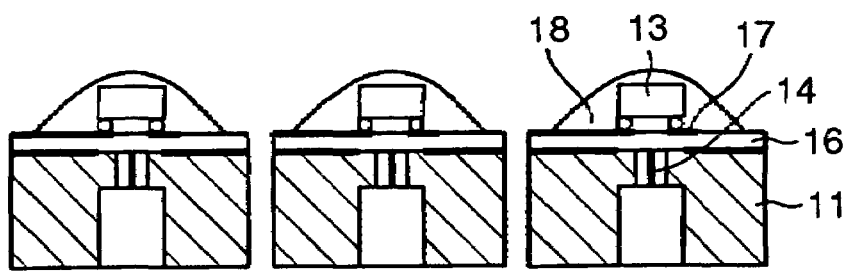

The following steps shown in FIGS. 4(c) through (e) are performed in the same manner as those in the first embodiment (see FIGS. 2(c) through (e)).

Consequently, with the configuration of the optic communications module 1a according to this embodiment, with a simple structure which makes the assembly and manufacturing process easy, an optic communications module with high alignment accuracy can be economically provided. Since the transparent resin film 16 is provided above the through-hole 12a, it is possible to provide a compact and economical optic communications module. In addition, since the transparent resin film 16 separates the optical element 13 and the optical fiber inserted into the through-hole 12a, the ambient air and moisture from the insertion side of the optical fiber have no adverse effect, which increases the sealing effect of the optical element. Furthermore, fixing the fiber optic piece in the small-diameter part, whose diameter is substantially the same as that of the fiber optic piece, of the through-hole can make the manufacturing process easier. The through-hole also has the large-diameter part into which a ferrule is inserted and whose diameter is substantially the same as that of the ferrule. Since the end of the ferrule faces a step between the small-diameter part and the large-diameter part, a shock caused by inserting and removing the ferrule does not have much effect on the fiber optic piece. Consequently, it is possible to provide an optic communications module that is hard to be damaged even if the ferrule is inserted and removed frequently.

Also, the manufacturing method according to this embodiment can provide the optic communications module 1a with high yields, as well as avoiding a damage of the transparent resin film 16 due to a pressure or shock caused by mounting the optical element 13. Moreover, since almost the whole assembly process of the optic communications module 1a is done by batch processing on a single base plate, it is possible to economically mass produce optic communications modules with high yields.

While the small-diameter part of the through-hole 12a is provided on the first plane 19 side and the large-diameter part is provided on the second plane 20 side in the above-mentioned example, it is also possible to have the large-diameter part of the through-hole 12a on the first plane 19 side and the small-diameter part on the second plane 20 side. Furthermore, the diameter of the fiber optic piece 14 may be different from that of the optical fiber not shown in the drawing. Also, the ferrules or sleeves that may surround the fiber optic piece 14 and the optical fiber not always have the same diameter. With this configuration, it is possible to provide an optic communications module that is capable of coping with the diameters of the fiber optic piece 14 or the optical fiber, or of the ferrule or sleeve surrounding them, which enhances the versatility of design.

Figure 5:
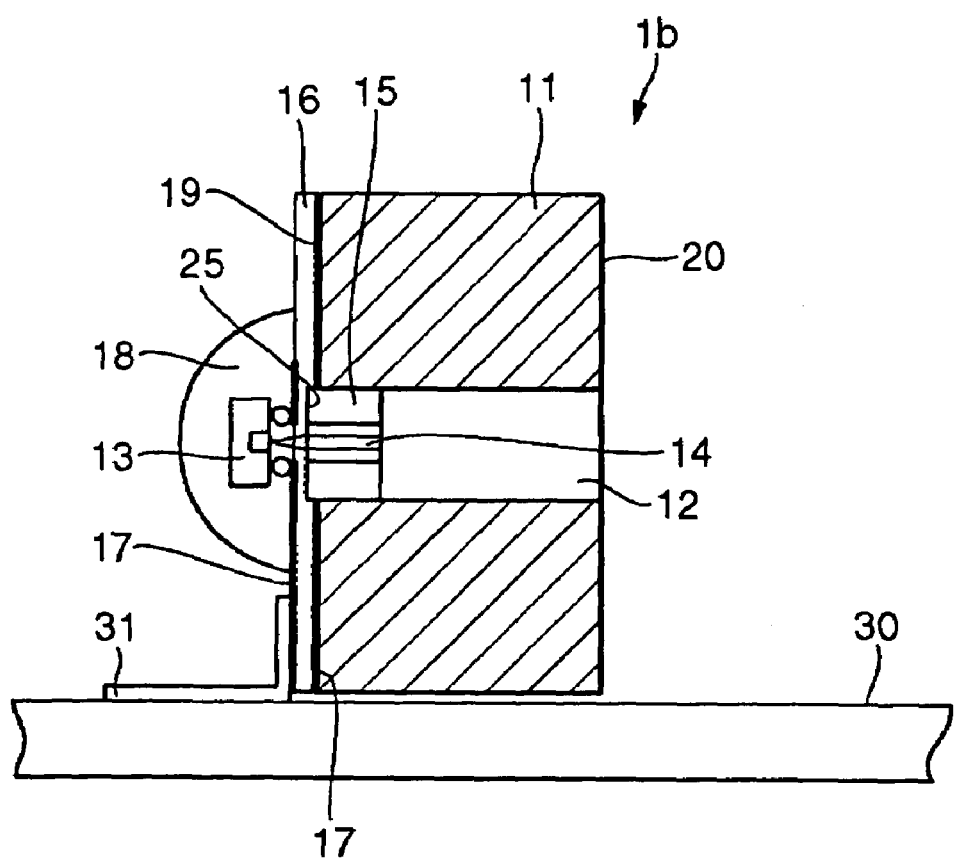
FIG. 5 is a sectional view of an optic communications device including an optic communications module according to a third embodiment of the invention.

FIG. 5 is a sectional view of an optic communications device including an optic communications module according to a third embodiment of the invention. The elements that are the same as the ones mentioned above are indicated by the same numerals and further description of them is omitted here. An optic communications module 1b has the same configuration as that of the optic communications module 1 shown in FIG. 1, except in that one end of the fiber optic piece 14 provided with the ferrule 15 projects from the first plane 19 of the base 11 and the transparent resin film 16 has a concave 25 that matches the projecting part of the fiber optic piece 14 provided with the ferrule 15.

Now, a method for manufacturing the optic communications module 1b of this embodiment having such a configuration will be described.

FIG. 6 is a view illustrating a method for manufacturing the optic communications module according to the third embodiment. The step shown in FIG. 6(a) is performed in the same manner as that in the first embodiment (see FIG. 2(a)).

Figure 6A:
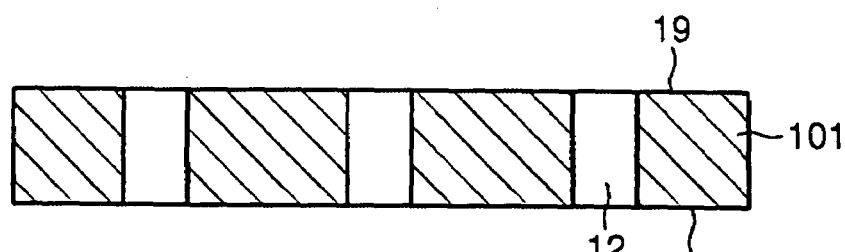
FIG. 6 is a view illustrating a method for manufacturing the optic communications module according to the third embodiment.
Figure 6B:
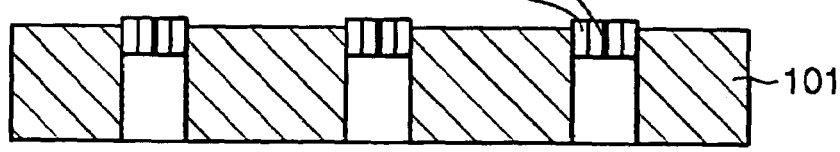

Next, the fiber optic piece 14 is pressed into and fixed in the through-hole 12 in a way that one end of the fiber optic piece 14 provided with the ferrule 15 projects from the first plane 19 side of the base plate 101 as shown in FIG. 6(b).

Figure 6C:
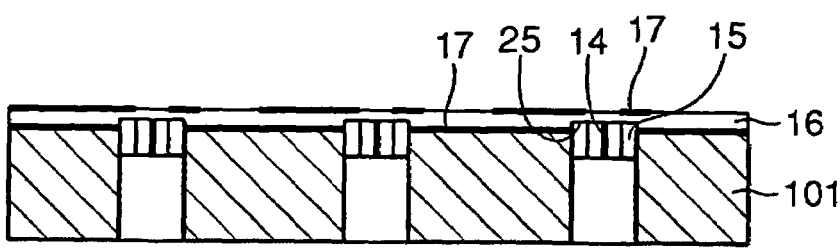

Then, the transparent resin film 16 and the wiring film 17 are provided on the upper surface of the base plate 101 as shown in FIG. 6(c). While an FPC similar to the one used in the first embodiment is suitable for use in this step, it is necessary to provide the concave 25 in a portion associated with the projecting part of the fiber optic piece 14 provided with the ferrule 15. The concave 25 may be formed by etching or pressing using a jig.

Figure 6D:
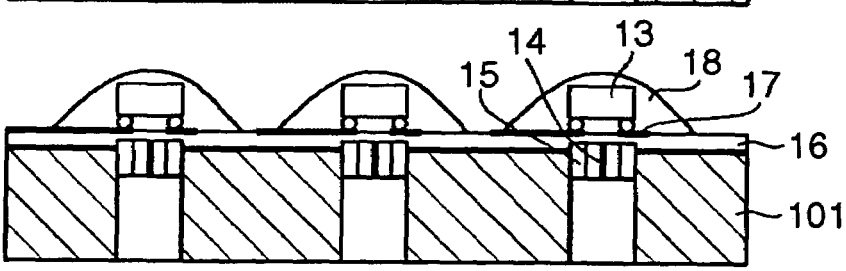
Figure 6E:
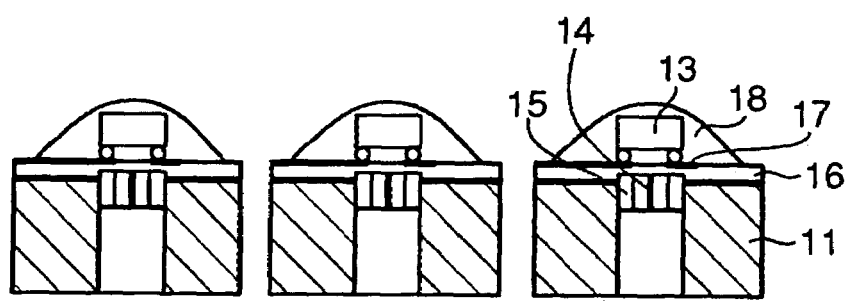

The following steps shown in FIGS. 6(c) through (e) are performed in the same manner as those in the first embodiment (see FIGS. 2(c) through (e)).

Consequently, with the configuration of the optic communications module 1b according to this embodiment, an optic communications module with a simple structure and high alignment accuracy can be economically provided. Moreover, the simple structure makes the assembly easy and the manufacturing process simple, which eventually enhances yields. Since the transparent resin film 16 is provided above the through-hole 12, it is possible to provide a compact and economical optic communications module. In addition, since the transparent resin film 16 separates the optical element 13 and the optical fiber inserted into the through-hole 12, the ambient air and moisture from the insertion side of the optical fiber have no adverse effect, which increases the sealing effect of the optical element. Furthermore, it is possible to shorten the optical coupling distance between the fiber optic piece and the optical element, which further reduces optical loss.

Also, the manufacturing method according to this embodiment can provide the optic communications module 1b with high yields, as well as avoiding a damage of the transparent resin film 16 due to a pressure or shock caused by mounting the optical element 13. Moreover, since almost the whole assembly process of the optic communications module 1b is done by batch processing on a single base plate, it is possible to economically mass produce optic communications modules with high yields.

While the diameter of the through-hole 12 is substantially even in the above-mentioned example, using the through-hole 12a whose diameter is uneven like in the second embodiment can also produce the same effect by making the fiber optic piece 14 project from the first plane 19 side.

Figure 7:
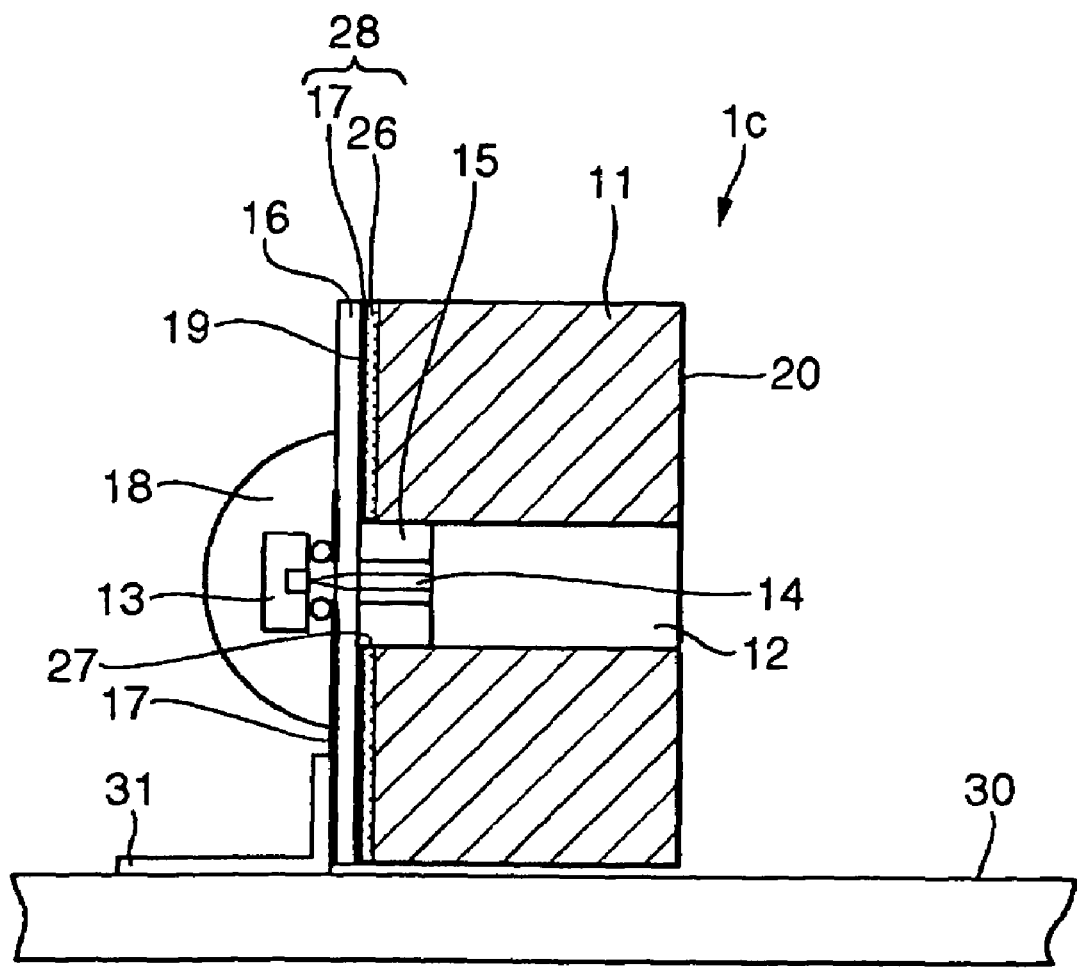
FIG. 7 is a sectional view of an optic communications device including an optic communications module according to a fourth embodiment of the invention.

FIG. 7 is a sectional view of an optic communications device including an optic communications module according to a fourth embodiment of the invention. An optic communications module 1c of the present embodiment has almost the same configuration as that of the optic communications module 1b of the third embodiment. The elements common to the two are indicated by the same numerals and further description of them is omitted here, while differences between the two will be described below.

In the fourth embodiment, a hole 27 matching the projecting part of the fiber optic piece 14 is provided in an inner layer 28 formed between the transparent resin film 16 and the base 11 and composed of the wiring film 17 and a bonding sheet 26.

The hole 27 may be formed by providing the inner layer 28 on the transparent resin film 16 and removing part of the inner layer 28 into which the projecting part of the fiber optic piece 14 is inserted by etching, for example. Alternatively, the hole 27 may be formed by providing the inner layer 28 on the base 11 so as to leave off a part in which the fiber optic piece 14 projects.

By providing the hole 27 in the inner layer 28 for holding the end of the fiber optic piece 14 in this embodiment, it is possible to shorten the coupling distance between the fiber optic piece 15 and the optical element 13, and thereby avoiding a reduction in optical coupling efficiency attributed to the thickness of the inner layer 28. Here, it is preferable that the projecting part of the fiber optic piece is substantially as thick as the inner layer, i.e., the length of the hole. This allows the end of the projecting part of the fiber optic piece 14 to face the transparent resin film 16, which further reduces optical coupling loss. Furthermore, since this embodiment requires no modifying or processing of the transparent resin film 16, the optic communications module with high accuracy can be provided with a simple manufacturing process.

It is understood that the optic communications module 1c of this embodiment is manufactured in the same manner as the method of the third embodiment.

FIG. 8 is a view illustrating a method for manufacturing an optic communications module according to a fifth embodiment of the invention. The elements common to the first and fifth embodiments are indicated by the same numerals and further description of them is omitted here.

First, as FIG. 8(a) shows, a jig including more than one convex 40a on one side for holding the base is provided. The axis length of the convex 40a is set so that the convex 40a fits in a portion (support part) which supports an inserted optical fiber in the through-hole 12 of the base 11. It is preferably shorter than the axis length of the support part. Thus, the end of the convex 40a does not face the end of the fiber optic piece 14, which prevents the end of the fiber optic piece 14 from being damaged.

Next, more than one unit base 11 each corresponding to the optic communications module 1 and having the through-hole 12 is located in a way that the through-hole 12 fits the convex 40a of a jig 40 as shown in FIG. 8(b).

Next, the fiber optic piece 14 provided with the ferrule 15 that is shorter than the distance from the first plane 19 of the unit base 11 to the second plane 20 is pressed and fixed, so as to reach substantially the same plane as the first plane 19 of the unit base 11 as shown in FIG. 8(c). Subsequently, the gap between each unit base 11 is filled with a fixing agent 41 for fixing each unit base 11 so as to form a single base plate, and then the fixing agent 41 is hardened. Since each unit base 11 is to be divided in the following step (see FIG. 8(g)), the fixing agent 41 is preferably a material easy to be removed from the unit base 11.

The following steps shown in FIGS. 8(*d*) and (*e*) are performed in the same manner as those in the first embodiment (see FIGS. 2(*c*) and (*d*)).

Next, the transparent resin film 16 is divided into individual pieces each making up the optic communications module 1 as shown in FIG. 8(*f*). The division in this step is done by dicing, laser cutting, or the like. If the fixing agent 41 is difficult to be removed from the unit base 11, they may be separated in the same manner.

Then, as FIG. 8(*g*) shows, each unit base 11 is detached from the jig 40, which completes the optic communications module 1 of the embodiment.

The manufacturing method according to this embodiment can provide the optic communications module 1 with high yields, as well as avoiding a damage of the transparent resin film 16 due to a pressure or shock caused by mounting the optical element 13. Moreover, since almost the whole assembly process of the optic communications module 1 is done by batch processing on a single base plate, it is possible to economically mass produce optic communications modules with high yields.

The optic communications module 1 of the embodiment is suitable for use in an optic communications device (optical transceiver). Such an optic communications device to which the invention is applied can be used for various electronic equipment for information communications with an external device etc. via light as a transmission medium. Examples of these may include personal computers and personal digital assistants (PDA).

It should be noted that the invention is not limited to the above-mentioned embodiments, and various modifications and changes can be made without departing from the spirit and scope of the invention. For example, while one through-hole 12 (12*a*) into which an optical fiber is inserted is provided in the embodiments, a plurality of such through-holes may be provided instead.

FIG. 9 shows an example of an optic communications module including a plurality of optical elements. The elements that are the same as the ones used in the first embodiment are indicated by the same numerals and further description of them is omitted here. An optic communications module 1*d* includes on the base 11 more than one through-hold 12 and more than one optical element 13 each associated with one through-hole 12.

The optic communications module 1*d* can be manufactured in the same manner as the first embodiment, except in that the base 11 or the base plate 101 is provided with more than one through-hole 12 in predetermined positions. The optic communications module 1*d* can produce the same effect as the first embodiment. Moreover, by providing more than one through-hole 12, an optic communications module for coping with multi-channel systems and an optic communications module providing an all-in-one solution for sending out and receiving information can be achieved.

What is claimed is:

1. An optic communications module, comprising:
   a base including a portion defining a through-hole through a first plane to a second plane into which an optical fiber is inserted;
   a fiber optic piece located in the through-hole on the first plane side of the base having an axis length that is shorter than a distance between the first plane of the base and the second plane of the base;
   a transparent film that is provided on the first plane of the base so as to cover the through-hole;
   a wiring film that is provided on at least one surface of the transparent film; and
   an optical element that is aligned on an optical axis of the fiber optic piece with the transparent film therebetween and coupled to the wiring film.

2. The optic communications module according to claim 1, the transparent film being resin.

3. The optic communications module according to claim 1, the fiber optic piece being surrounded and covered by a ferrule.

4. The optic communications module according to claim 1, a diameter of the through-hole on the first plane side of the base being substantially the same as a diameter of the fiber optic piece and a diameter of the through-hole on the second plane side of the base being substantially the same as a diameter of a ferrule covering the optical fiber inserted into the through-hole.

5. The optic communications module according to claim 1, the fiber optic piece being located so as to have one end reaching the first plane of the base.

6. The optic communications module according to claim 1, the transparent film having a concave on the plane by a side opposite the base.

7. The optic communications module according to claim 1, the fiber optic piece being located so as to have one end projecting outward of the base from the first plane of the base.

8. The optic communications module according to claim 1, further comprising:
   an inner layer including the wiring film provided between the transparent film and the base;
   the fiber optic piece being located so as to project outward of the base from the first plane of the base, and a projecting part of the fiber optic piece that is inserted into a hole provided in the inner layer.

9. The optic communications module according to claim 1, the transparent film and the wiring film being formed with a flexible printed circuit.

10. The optic communications module according to claim 1, the wiring film being provided to each of both sides of the transparent film, and the transparent film and the wiring film on the both sides make up a microstrip line.

11. An optic communications device, comprising:
    the optic communications module according to claim 1.

12. Electronic equipment, comprising:
    the optic communications module according to claim 1.

* * * * *